US009791712B2

(12) United States Patent
Iwami

(10) Patent No.: US 9,791,712 B2
(45) Date of Patent: Oct. 17, 2017

(54) CONDUCTIVE FILM, DISPLAY DEVICE EQUIPPED WITH SAME, AND METHOD FOR DETERMINING PATTERN OF CONDUCTIVE FILM

(71) Applicant: FUJIFILM Corporation, Tokyo (JP)

(72) Inventor: Kazuchika Iwami, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 517 days.

(21) Appl. No.: 14/500,308

(22) Filed: Sep. 29, 2014

(65) Prior Publication Data

US 2015/0015980 A1 Jan. 15, 2015

Related U.S. Application Data

(63) Continuation of application No. PCT/JP2013/055287, filed on Feb. 28, 2013.

(30) Foreign Application Priority Data

Mar. 30, 2012 (JP) ................................ 2012-082706

(51) Int. Cl.
*G02B 27/60* (2006.01)
*H05K 9/00* (2006.01)
(Continued)

(52) U.S. Cl.
CPC ............ *G02B 27/60* (2013.01); *G06F 3/044* (2013.01); *G06F 17/5009* (2013.01);
(Continued)

(58) Field of Classification Search
CPC .................... G02B 27/60; G06F 3/044; G06F 2203/04112; G06F 17/5009; H05K 1/0274; H05K 9/0096
See application file for complete search history.

(56) References Cited

U.S. PATENT DOCUMENTS

2011/0102361 A1 5/2011 Philipp
2013/0028503 A1 1/2013 Wakui et al.
2015/0015979 A1* 1/2015 Iwami ................ H05K 9/0096 359/893

FOREIGN PATENT DOCUMENTS

JP 2009-117683 A 5/2009
JP 2010-79140 A 4/2010
JP 2011-216379 A 10/2011

OTHER PUBLICATIONS

International Preliminary Report on Patentability issued in PCT/JP2013/055287 dated Oct. 9, 2014 (Forms PCT/IB/338; PCT/IB/373 and PCT/ISA/237).

(Continued)

*Primary Examiner* — Liliana Cerullo
(74) *Attorney, Agent, or Firm* — Birch, Stewart, Kolasch & Birch, LLP

(57) ABSTRACT

This conductive film has a randomized wiring pattern having randomized rhomboid shapes obtained by giving irregularity in a predetermined range to rhomboid shapes of a rhomboidal wiring pattern which, with respect to frequencies of moire and intensities of moire obtained by applying a visual response characteristic of human beings to frequency information of moire and intensity information of moire calculated from peak frequencies and peak intensities in both two-dimensional Fourier spectra of transmittance image data of the wiring pattern and transmittance image data of the pixel array pattern, causes a sum of intensities of moire each corresponding to each of frequencies of moire falling within a predetermined frequency range determined depending on the visual response characteristic to be less than or equal to a predetermined value. The conductive film allows suppression of moire and significant improvement in visibility.

14 Claims, 7 Drawing Sheets

(51) Int. Cl.
*G06F 17/50* (2006.01)
*H05K 1/02* (2006.01)
*G06F 3/044* (2006.01)

(52) U.S. Cl.
CPC ......... *H05K 1/0274* (2013.01); *H05K 9/0096* (2013.01); *G06F 2203/04112* (2013.01)

(56) References Cited

OTHER PUBLICATIONS

Extended European Search Report for European Application No. 13769947.6, dated Nov. 6, 2015.
Korean Office Action, dated Sep. 26, 2016, for Korean Application No. 10-2014-7027319, including partial English translation.
International Search Report, issued in PCT/JP2013/055287, dated Jun. 4, 2013.

* cited by examiner

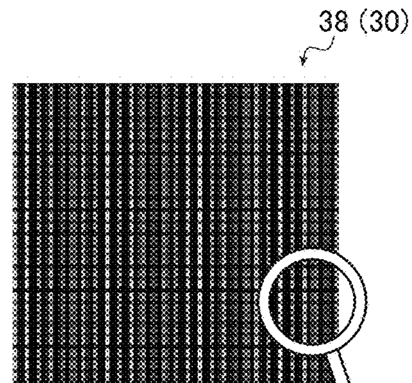
FIG. 7A
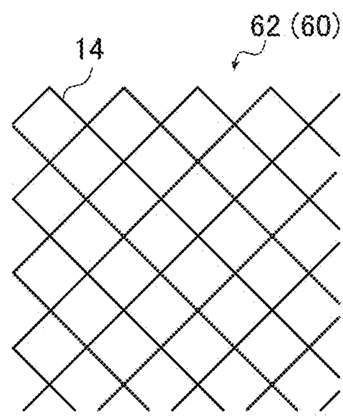
FIG. 7B
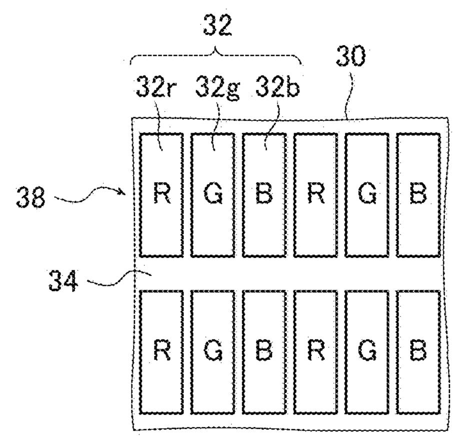
FIG. 7C
FIG. 8
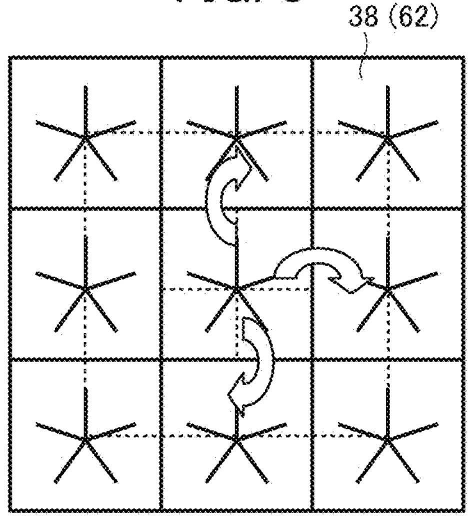

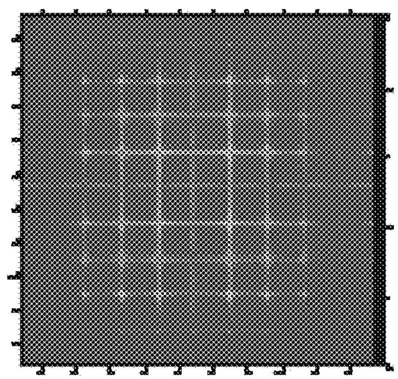
FIG. 9A
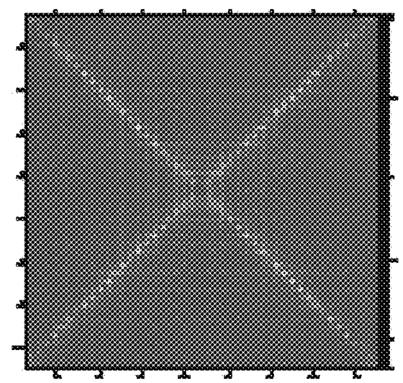
FIG. 9B
FIG. 10
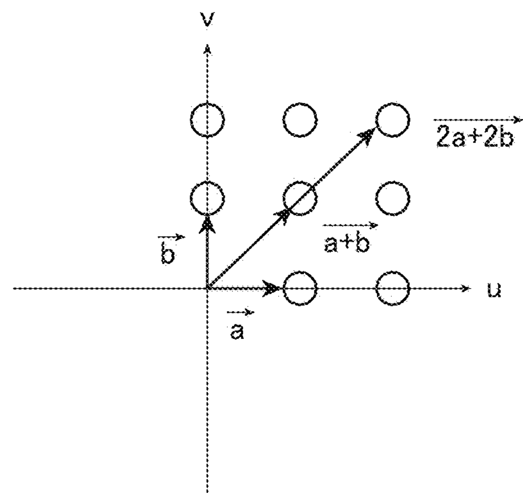
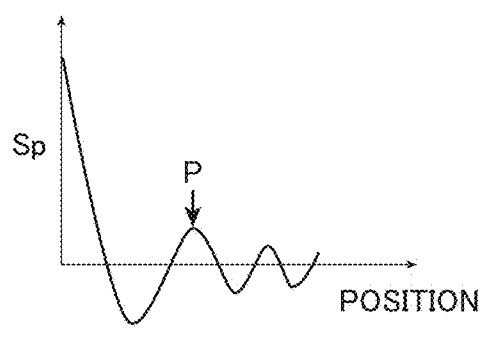
FIG. 11A
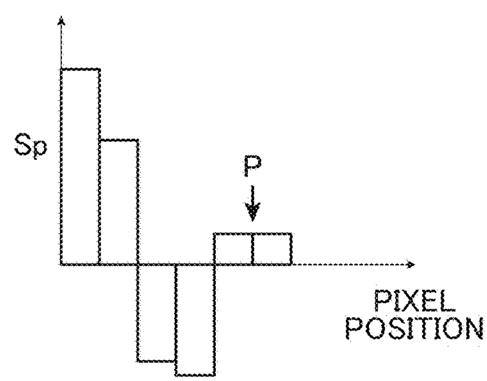
FIG. 11B

CONDUCTIVE FILM, DISPLAY DEVICE EQUIPPED WITH SAME, AND METHOD FOR DETERMINING PATTERN OF CONDUCTIVE FILM

CROSS-REFERENCE TO RELATED APPLICATIONS

This application is a continuation of International Application No. PCT/JP2013/055287 filed on Feb. 28, 2013, which claims priority under 35 U.S.C. §119(a) to Japanese Patent Application No. 2012-082706 filed on Mar. 30, 2012. Each of the above applications is hereby expressly incorporated by reference, in its entirety, into the present application.

BACKGROUND OF THE INVENTION

The present invention relates to a conductive film, a display device equipped with the conductive film, and a method for determining a pattern of the conductive film.

Examples of a conductive film installed on a display unit of a display device (hereinafter also referred to as "display") include a conductive film for electromagnetic shields and a conductive film for touch panels (for example, see JP 2009-117683 A and JP 2011-216379 A).

JP 2009-117683 A, a published patent application filed by the same applicant as the present application, discloses that a second pattern, which is generated from second pattern data in which the relative distance between spectrum peaks of two-dimensional Fourier spectrums (2DFFT Sp) of the respective pattern data of a first pattern such as a pixel array pattern (for example, a black matrix (hereinafter also referred to as "BM") pattern) of a display and the second pattern such as an electromagnetic shield pattern is greater than a predetermined spatial frequency, for example, 8 $cm^{-1}$, is automatically selected.

JP 2009-117683 A also discloses that when the relative distance is not greater than the predetermined spatial frequency, changing of one or more of a rotation angle, a pitch and a pattern width in the second pattern data to generate new second pattern data is repeated until the relative distance is greater than the predetermined spatial frequency.

In this way, in JP 2009-117683 A, it is possible to automatically select an electromagnetic shield pattern that can suppress the occurrence of moire and that can avoid an increase in surface resistivity or degradation in transparency.

JP 2011-216379 A, another published patent application filed by the same applicant as the present application, discloses a transparent conductive film having a mesh pattern comprising a plurality of polygonal meshes, in which the mesh pattern is formed such that, in relation to a centroid spectrum of respective meshes, an average intensity on the side of a spatial frequency band higher than a predetermined spatial frequency, for example, a spatial frequency at which a human visual response characteristic corresponds to 5% of the maximum response, is greater than an average intensity on the side of a spatial frequency band lower than the predetermined spatial frequency.

It is stated in JP 2011-216379 A that a transparent conductive film is provided which is capable of lowering the sensation of granular noise caused by the pattern and significantly enhancing the visibility of objects to be observed, and has a stable power capability even after being cut.

SUMMARY OF THE INVENTION

In the technology as disclosed in JP 2009-117683 A, during the generation of a wiring pattern of a conductive film, a moire frequency is only controlled on the basis of frequency information of a BM (black matrix) pattern of a display/the wiring pattern so as to provide a wiring pattern excellent in visibility, that is to say, the determination of whether moire is visually recognized or not only depends on the frequency. Since human perception of moire is influenced by intensity as well as frequency, moire may be visually recognized depending on the intensity even at a frequency at which moire is not determined to be visually recognized in JP 2009-117683 A, and thus there is a problem in that the wiring pattern of the conductive film is not adequately improved in visibility of moire. Particularly when the technology of JP 2009-117683 A is applied to a conductive film for touch panels, since the conductive film is pressed with a finger or the like, a delicate distortion occurs between the BM/wiring patterns, and accordingly there is a problem in that visual recognition of moire due to intensity is promoted, leading to an inadequate improvement in moire visibility.

In JP 2011-216379 A, in relation to a centroid spectrum of respective meshes of the mesh pattern of the transparent conductive film, an average intensity in a mid to high spatial frequency band, which is higher than the predetermined spatial frequency and in which human visual response characteristic rapidly decreases, is made greater than an average intensity in a low spatial frequency band, in which human visual response characteristic is high, so as to reduce the sensation of noise visually perceived by human beings. The disclosed invention merely aims at reducing the sensation of noise of the mesh pattern in itself of the transparent conductive film and is not drawn to the improvement in moire visibility by suppressing moire occurring between the BM pattern of the display and the mesh pattern of the transparent conductive film.

The present invention has been made in order to solve the above-described problems with the prior art, and an object of the present invention is to provide a conductive film capable of suppressing the occurrence of moire to greatly improve visibility, a display device equipped with such a conductive film, and a method for determining a pattern of a conductive film.

In particular, the present invention aims at providing a conductive film which is capable of suppressing the occurrence of moire considerably deteriorating the image quality when a transparent conductive film with wiring is used as an electrode of a touch panel and a display unit of a display device is viewed through the conductive film superimposed on a black matrix of the display unit, so as to greatly improve visibility of the display on the touch panel, a display device equipped with such a conductive film, and a method for determining a pattern of a conductive film.

In order to achieve the objects as above, the conductive film according to a first aspect of the present invention is a conductive film adapted to be installed on a display unit of a display device, comprising: a transparent substrate; and a conductive portion including a plurality of thin metal wires that is formed on at least one surface of the transparent substrate, wherein the conductive portion has a wiring pattern obtained by giving irregularity to a rhomboidal wiring pattern, the wiring pattern being formed by the plurality of thin metal wires in a meshed manner and arraying a plurality of openings, wherein the wiring pattern is superimposed on a pixel array pattern of the display unit, and wherein the wiring pattern is a randomized wiring pattern having randomized rhomboid shapes obtained by giving the irregularity in a predetermined range determined depending on a width of the thin metal wires to rhomboid shapes of the rhomboidal wiring pattern which, with respect to frequencies of moire and intensities of moire obtained by applying a visual response characteristic of human beings to frequency information of moire and intensity information of moire calculated from peak frequencies and peak intensities of plural spectrum peaks in a two-dimensional Fourier spectrum of transmittance image data of the rhomboidal wiring pattern and peak frequencies and peak intensities of plural spectrum peaks in a two-dimensional Fourier spectrum of transmittance image data of the pixel array pattern, causes a sum of intensities of moire each corresponding to each of frequencies of moire falling within a predetermined frequency range determined depending on the visual response characteristic to be less than or equal to a predetermined value.

In order to achieve the objects as above, the display device according to a second aspect of the present invention is a display device comprising: a display unit; and the conductive film according to the first aspect that is installed on the display unit.

In order to achieve the objects as above, the method for determining a wiring pattern of a conductive film according to a third aspect of the present invention is a method for determining a wiring pattern of a conductive film, with the conductive film being adapted to be installed on a display unit of a display device and to have a wiring pattern obtained by giving irregularity to a rhomboidal wiring pattern, said wiring pattern being formed by the plurality of thin metal wires in a meshed manner and arraying a plurality of openings, comprising the steps of: acquiring transmittance image data of a predetermined wiring pattern and transmittance image data of a pixel array pattern of the display unit, on which pattern the predetermined wiring pattern is superimposed; calculating peak frequencies and peak intensities of plural spectrum peaks in a two-dimensional Fourier spectrum of the transmittance image data of the predetermined wiring pattern and peak frequencies and peak intensities of plural spectrum peaks in a two-dimensional Fourier spectrum of the transmittance image data of the pixel array pattern by performing a two-dimensional Fourier transform on the transmittance image data of the predetermined wiring pattern and the transmittance image data of the pixel array pattern; calculating frequency information of moire and intensity information of moire from the peak frequencies and the peak intensities of the predetermined wiring pattern and the pixel array pattern thus calculated, respectively; calculating frequencies of moire and intensities of moire by applying a visual response characteristic of human beings to the frequency information of moire and the intensity information of moire thus obtained; making comparison with respect to the frequencies of moire and the intensities of moire thus obtained such that a sum of intensities of moire each corresponding to each of frequencies of moire falling within a predetermined frequency range determined depending on the visual response characteristic is compared with a predetermined value; changing the transmittance image data of the predetermined wiring pattern to transmittance image data of a new wiring pattern if the sum of the intensities of moire is greater than the predetermined value, and repeating the steps of calculating the peak frequencies and the peak intensities, calculating the frequency information of moire and the intensity information of moire, calculating the frequencies of moire and the intensities of moire, and making comparison between the sum of the intensities of moire and the predetermined value until the sum of the intensities of moire is less than or equal to the predetermined value; setting a rhomboidal wiring pattern which causes the sum of the intensities of moire to be less than or equal to the predetermined value as the wiring pattern of the conductive film; and giving the irregularity in a predetermined range determined depending on a width of the thin metal wires to rhomboid shapes of the set rhomboidal wiring pattern, and determining a randomized wiring pattern having randomized rhomboid shapes that the irregularity is given to be the wiring pattern of the conductive film.

In each of the first, second and third aspects, it is preferable that, when a direction in which the irregularity is given to the rhomboid shape is a direction parallel or perpendicular to a side of rhomboid, the irregularity is defined as a ratio of an average according to a normal distribution for a pitch of rhomboid after the irregularity is given with respect to the pitch of rhomboid before the irregularity is given, and that the predetermined range of the irregularity is from 2% to 20% when the width of the thin metal wires is less than or equal to 3 μm and the predetermined range of the irregularity is from 2% to 10% when the width of the thin metal wires is greater than 3 μm.

The pitch of rhomboid is preferably preserved before and after the irregularity is given when the direction in which the irregularity is given to the rhomboid shape is the direction parallel to a side of rhomboid, and an angle of rhomboid is preferably preserved before and after the irregularity is given when the direction in which the irregularity is given to the rhomboid shape is the direction perpendicular to a side of rhomboid.

It is also preferable that the predetermined frequency range of the frequency of moire is up to 3 cycles/mm, and that the wiring pattern undergoes ranking for optimization if it involves a frequency of moire less than or equal to 3 cycles/mm, and the wiring pattern undergoing the ranking for optimization causes the sum of intensities of moire to be less than or equal to 0 in terms of common logarithm on condition that the wiring pattern does not undergo the ranking for optimization if it involves an intensity of moire greater than or equal to −5 in terms of common logarithm at a frequency of moire less than or equal to 1.8 cycles/mm and if it involves an intensity of moire greater than or equal to −3.7 in terms of common logarithm at a frequency of moire greater than 1.8 cycles/mm but not greater than 3 cycles/mm.

Preferably, the frequency information of moire is given as differences between the peak frequencies of the wiring pattern and the peak frequencies of the pixel array pattern and the intensity information of moire is given as products of the peak intensities of the wiring pattern and the peak intensities of the pixel array pattern.

The frequency of moire and the intensity of moire are preferably obtained by performing convolution with a visual transfer function as the visual response characteristic on the frequency information of moire and the intensity information of moire. The visual transfer function is preferably a function in which attenuation in sensitivity to low-frequency components is removed from a Dooley-Shaw function as a basis.

It is preferable that the peak intensities are each an average of intensities in a plurality of pixels around the peak position, and are normalized with the transmittance image data of the wiring pattern and the pixel array pattern.

The pixel array pattern is preferably a black matrix pattern.

The frequency information of moire is preferably obtained as differences between the peak frequencies of the wiring pattern and the peak frequencies of the pixel array pattern, and the intensity information of moire is preferably obtained as products of two sets of vector intensities, with one set comprising the peak intensities of the wiring pattern and the other comprising the peak intensities of the pixel array pattern.

As described above, according to the present invention, it is possible to suppress the occurrence of moire to greatly improve visibility.

That is, in the present invention, since the frequencies/intensities of moire are calculated from the peak frequencies/intensities obtained by frequency analysis of the pixel array pattern of the display device and the wiring pattern of the conductive film and the calculated intensities and frequencies of moire are numerically limited so as to obtain excellent visibility and the irregularity is given to the wiring pattern, it is possible to prevent the deterioration of image quality due to the occurrence of moire and thus to achieve excellent visibility.

Particularly, according to the present invention, it is possible to suppress moire considerably deteriorating the image quality when a conductive film is used as an electrode of a touch panel and a display unit of a display device is viewed through the conductive film superimposed on a black matrix of the display unit, so as to greatly improve visibility of the display on the touch panel.

BRIEF DESCRIPTION OF THE DRAWINGS

FIG. 7A is a diagram schematically illustrating an example of a pixel array pattern of the display unit to which the conductive film according to the present invention is applied, FIG. 7B is a diagram schematically illustrating an example of a wiring pattern of the conductive film superimposed on the pixel array pattern illustrated in FIG. 7A, and FIG. 7C is a partially enlarged view of the pixel array pattern illustrated in FIG. 7A.

FIG. 8 is a diagram schematically illustrating an example of flipping processing that is performed in preparing transmission image data in the method for determining a wiring pattern illustrated in FIG. 6.

FIGS. 9A and 9B are diagrams respectively illustrating intensity characteristics of two-dimensional Fourier spectrums of transmittance image data of the pixel array pattern illustrated in FIG. 7A and the wiring pattern illustrated in FIG. 7B.

FIG. 10 is a graph illustrating frequency peak positions of the pixel array pattern of the display unit illustrated in FIG. 7A.

FIGS. 11A and 11B are graphs illustrating an example of the intensity characteristic of a two-dimensional Fourier spectrum with a curve and bars, respectively.

DETAILED DESCRIPTION OF THE INVENTION

Hereinafter, a conductive film and a method for determining a pattern of a conductive film according to the present invention will be described in detail with reference to appropriate embodiments illustrated in the accompanying drawings.

In the following description, a conductive film for a touch panel will be explained as a representative example of the conductive film according to the present invention, although the present invention is not limited to this example. The conductive film of the invention may be of any type as long as it is a conductive film installed on a display unit of a display device such as a liquid crystal display (LCD), a plasma display panel (PDP), an organic electroluminescence display (OLED), or an inorganic EL display. It is needless to say that the conductive film according to the present invention may be, for example, a conductive film for electromagnetic shields.

Figure 1:
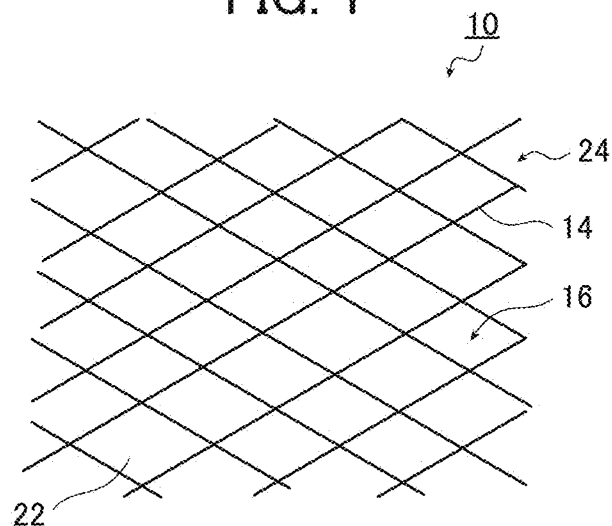
FIG. 1 is a plan view schematically illustrating an example of a conductive film according to a first embodiment of the present invention.
Figure 2:
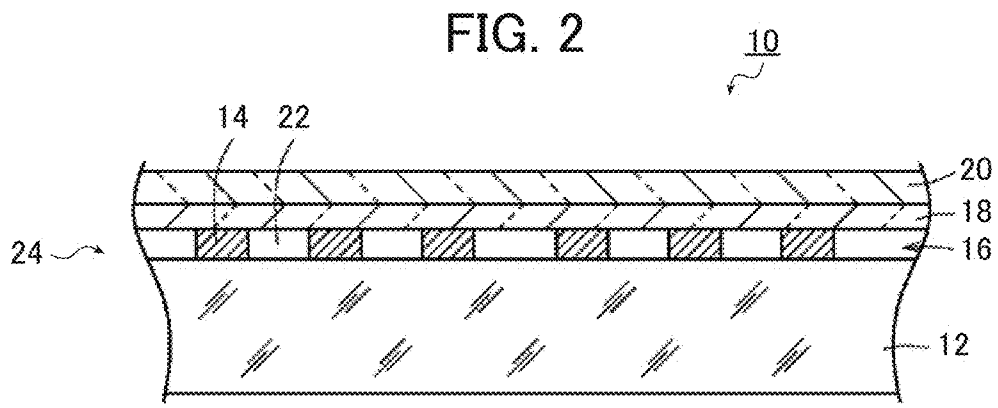
FIG. 2 is a partial cross-sectional view schematically illustrating the conductive film illustrated in FIG. 1.

FIGS. 1 and 2 are respectively a plan view schematically illustrating an example of a conductive film according to a first embodiment of the present invention and a schematic partial cross-sectional view thereof.

A conductive film 10 according to this embodiment illustrated in the drawings is to be installed on a display unit of a display device and is a conductive film having a wiring pattern that is excellent in suppression of occurrence of moire with respect to a black matrix (BM) of the display unit, particularly, a wiring pattern that is optimized in terms of visibility of moire with respect to the BM pattern when it is superimposed on the BM pattern. The conductive film 10 includes a transparent substrate 12, a conductive portion 16 that is formed on one surface of the transparent substrate 12 (surface on the upper side in FIG. 2) and that is composed of plural thin wires made of metal (hereinafter referred to as "thin metal wires") 14, and a protective layer 20 bonded to the substantially entire surface of the conductive portion 16 via an adhesive layer 18 so as to cover the thin metal wires 14.

The transparent substrate 12 is formed of a material having an insulating property and having a high light-permeability, and examples thereof include a resin, glass, and silicon. Examples of the resin include polyethylene terephthalate (PET), polymethyl methacrylate (PMMA), polypropylene (PP), and polystyrene (PS).

The conductive portion 16 has a wiring pattern 24 of a meshed shape which is formed by the thin metal wires 14 with openings 22 between neighboring thin metal wires 14. The thin metal wires 14 are not particularly limited as long as they are made of metal having high conductivity, with an example being those made of gold (Au), silver (Ag) or copper (Cu). While it is more preferable indeed in terms of visibility if the thin metal wires 14 have a smaller line width, the line width has only to be 30 μm or smaller, for instance. For application to a touch panel, the line width of the thin metal wires 14 preferably ranges from 0.1 μm to 15 μm, more preferably from 1 μm to 9 μm, and still more preferably from 2 μm to 7 μm.

Specifically, the conductive portion 16 has the wiring pattern 24 in which the thin metal wires 14 are arranged in a meshed manner. In the present invention, the mesh shape of the openings 22 is a rhomboid-based shape with predetermined irregularity given thereto. The present invention is not limited in mesh shape to the illustrated example, and any rhomboid-based shape may be employed as long as it has been randomized by giving predetermined irregularity to the rhomboidal wiring pattern as optimized in terms of visibility of moire with respect to a predetermined BM pattern to be described later. For example, shape into which the rhomboid shape is deformed such as a quadrangle including a parallelogram may be employed.

As a material of the adhesive layer 18, a wet lamination adhesive, a dry lamination adhesive, a hot melt adhesive or the like can be mentioned.

Similarly to the transparent substrate 12, the protective layer 20 is formed of a material having a high light-permeability, such as a resin, glass, and silicon. The refractive index n1 of the protective layer 20 is preferably of a value equal to or close to that of the refractive index n0 of the transparent substrate 12. In that case, the relative refractive index nr1 of the transparent substrate 12 with respect to the protective layer 20 is approximately 1.

In this specification, the refractive index refers to a refractive index for the light at a wavelength of 589.3 nm (sodium D ray). For example, in regard to resins, the refractive index is defined by ISO 14782: 1999 (corresponding to JIS K 7105) that is an international standard. In addition, the relative refractive index nr1 of the transparent substrate 12 with respect to the protective layer 20 is defined as nr1=n1/n0. Here, it is preferable that the relative refractive index nr1 be in a range of 0.86 to 1.15, and a range of 0.91 to 1.08 is more preferable.

By limiting the range of the relative refractive index nr1 as above to control light transmittance between two members, the transparent substrate 12 and the protective layer 20, improvement in moire visibility is further promoted.

The conductive film 10 according to the first embodiment described above has the conductive portion 16 on only one surface of the transparent substrate 12, but the present invention is not limited to this configuration, and the conductive film 10 may have the conductive portion on both surfaces of the transparent substrate 12.

Figure 3:
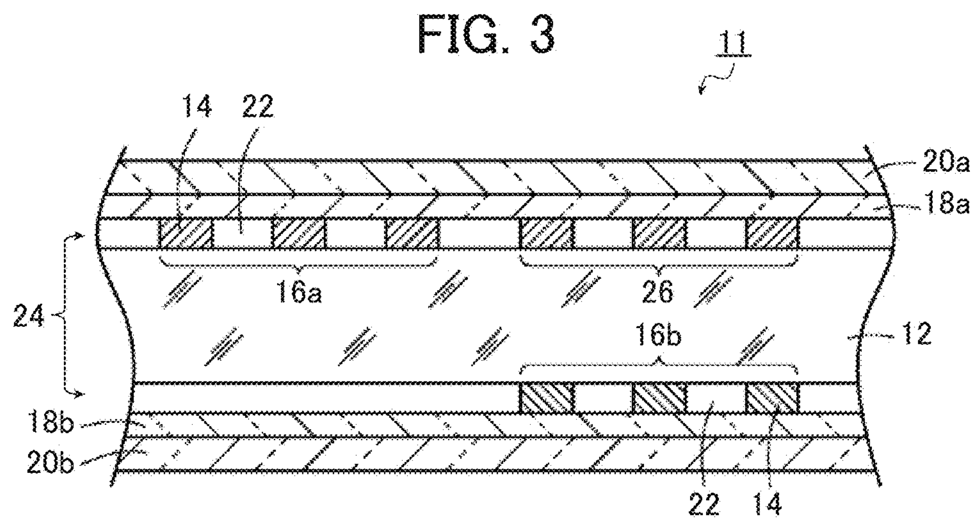
FIG. 3 is a partial cross-sectional view schematically illustrating an example of a conductive film according to a second embodiment of the present invention.

FIG. 3 is a partial cross-sectional view schematically illustrating an example of a conductive film according to a second embodiment of the present invention. The plan view of the conductive film according to the second embodiment illustrated in FIG. 3 is the same as the plan view of the conductive film according to the first embodiment illustrated in FIG. 1 and accordingly, will be omitted.

As illustrated in the drawing, a conductive film 11 according to the second embodiment includes a first conductive portion 16*a* and a dummy electrode portion 26 formed on one surface (on the upper side in FIG. 3) of a transparent substrate 12, a second conductive portion 16*b* formed on the other surface (on the lower side in FIG. 3) of the transparent substrate 12, a first protective layer 20*a* bonded to the substantially entire surface of the first conductive portion 16*a* and the dummy electrode portion 26 through a first adhesive layer 18*a*, and a second protective layer 20*b* boned to the substantially entire surface of the second conductive portion 16*b* through a second adhesive layer 18*b*.

In the conductive film 11, the first conductive portion 16*a* and the dummy electrode portion 26 are each composed of plural thin metal wires 14 and formed on one surface (on the upper side in FIG. 3) of the transparent substrate 12, and the second conductive portion 16*b* is composed of plural thin metal wires 14 and formed on the other surface (on the lower side in FIG. 3) of the transparent substrate 12. Here, the dummy electrode portion 26 is formed on one surface (on the upper side in FIG. 3) of the transparent substrate 12 similarly to the first conductive portion 16*a*, and has the thin metal wires 14 similarly arranged at positions corresponding to the thin metal wires 14 of the second conductive portion 16*b* formed on the other surface (on the lower side in FIG. 3), as illustrated in the drawing.

The dummy electrode portion 26 is separated from the first conductive portion 16*a* by a predetermined distance and is in the state of being electrically insulated from the first conductive portion 16*a*.

In the conductive film 11 according to this embodiment, since the dummy electrode portion 26 composed of plural thin metal wires 14 corresponding to the plural thin metal wires 14 of the second conductive portion 16*b* formed on the other surface (on the lower side in FIG. 3) of the transparent substrate 12 is formed on one surface (on the upper side in FIG. 3) of the transparent substrate 12, scattering due to the thin metal wires on the one surface (on the upper side in FIG. 3) of the transparent substrate 12 can be controlled, and it is thus possible to improve visibility of electrode.

Here, the first conductive portion 16*a* and the dummy electrode portion 26 have a wiring pattern 24 of a meshed shape which is formed by the thin metal wires 14 and openings 22. The second conductive portion 16*b* has a wiring pattern 24 of a meshed shape which is formed by the thin metal wires 14 and openings 22, similarly to the first conductive portion 16*a*. As described above, the transparent substrate 12 is formed of an insulating material and the second conductive portion 16*b* is in the state of being electrically insulated from the first conductive portion 16*a* and the dummy electrode portion 26.

In addition, the first and second conductive portions 16*a* and 16*b* and the dummy electrode portion 26 can be similarly formed of the same material as the conductive portion 16 of the conductive film 10 illustrated in FIG. 2.

The first protective layer 20*a* is bonded to the substantially entire surface of the first conductive portion 16*a* and the dummy electrode portion 26 with the first adhesive layer 18*a* so as to cover the thin metal wires 14 of the first conductive portion 16*a* and the dummy electrode portion 26.

The second protective layer 20*b* is bonded to the substantially entire surface of the second conductive portion 16*b* with the second adhesive layer 18*b* so as to cover the thin metal wires 14 of the second conductive portion 16*b*.

Here, the first adhesive layer 18*a* and the second adhesive layer 18*b* can be similarly formed of the same material as the adhesive layer 18 of the conductive film 10 illustrated in FIG. 2, and the material of the first adhesive layer 18*a* may be the same as or different from the material of the second adhesive layer 18*b*.

The first protective layer 20*a* and the second protective layer 20*b* can be similarly formed of the same material as the protective layer 20 of the conductive film 10 illustrated in FIG. 2, and the material of the first protective layer 20*a* may be the same as or different from the material of the second protective layer 20*b*.

The refractive index n2 of the first protective layer 20*a* and the refractive index n3 of the second protective layer 20*b* are each of a value equal or close to that of the refractive index n0 of the transparent substrate 12, similarly to the protective layer 20 of the conductive film 10 according to the first embodiment. In that case, the relative refractive index nr2 of the transparent substrate 12 with respect to the first protective layer 20*a* and the relative refractive index nr3 of the transparent substrate 12 with respect to the second protective layer 20*b* are each approximately 1. Here, the definitions of the refractive index and the relative refractive index are the same as the definitions in the first embodiment. Accordingly, the relative refractive index nr2 of the transparent substrate 12 with respect to the first protective layer 20*a* is defined as nr2=n2/n0, and the relative refractive index nr3 of the transparent substrate 12 with respect to the second protective layer 20*b* is defined as nr3=n3/n0.

Here, similarly to the relative refractive index nr1, it is preferable that the relative refractive index nr2 and the relative refractive index nr3 be in a range of 0.86 to 1.15, and a range of 0.91 to 1.08 is more preferable.

By limiting the range of the relative refractive index nr2 and the relative refractive index nr3 as above, improvement in moire visibility is further promoted, as is the case with the limitation of the range of the relative refractive index nr1.

Figure 4:
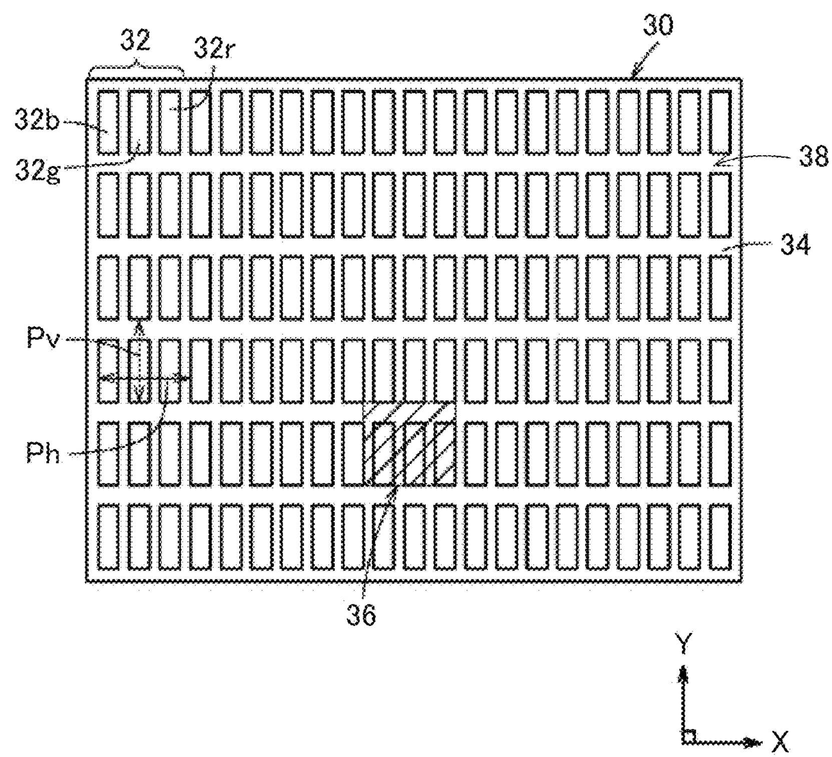
FIG. 4 is a diagram schematically illustrating an example of a pixel array pattern in a part of a display unit to which the conductive film according to the present invention is applied.

The conductive film 10 according to the first embodiment and the conductive film 11 according to the second embodiment of the present invention are applied to, for example, a touch panel of a display unit 30 (displaying section), of which a part is schematically illustrated in FIG. 4, and as such each have the rhomboidal wiring pattern as optimized in terms of visibility of moire with respect to the pixel array pattern, namely, black matrix (hereinafter also referred to as "BM") pattern of the display unit 30 and then given irregularity (or, randomized). In the present invention, the rhomboidal wiring pattern as optimized in terms of visibility of moire with respect to the BM (pixel array) pattern refers to a rhomboidal wiring pattern or a group of two or more rhomboidal wiring patterns making moire with respect to a predetermined BM pattern not perceived by human visual sensation. In the present invention, a group of two or more rhomboidal wiring patterns optimized may be ranked, from a rhomboidal wiring pattern making moire most difficult to perceive to a rhomboidal wiring pattern making moire somewhat difficult to perceive, so as to determine one rhomboidal wiring pattern which makes moire most difficult to perceive.

Further, in the present invention, the wiring pattern as optimized in terms of visibility of moire with respect to the BM (pixel array) pattern and then given irregularity (or, randomized) refers to a wiring pattern obtained by giving predetermined irregularity to the optimized wiring pattern as above in a predetermined direction, such as directions parallel and perpendicular to a side of the rhomboid of the wiring pattern, so as to randomize the optimized wiring pattern.

The optimization of a wiring pattern in terms of visibility of moire with respect to a predetermined BM pattern and the giving of irregularity to the optimized wiring pattern, which are essential to the present invention, will be described later.

The conductive film according to the present invention basically has the above-mentioned configuration.

FIG. 4 is a diagram schematically illustrating an example of a pixel array pattern in a part of the display unit to which the conductive film according to the present invention is applied.

As partially illustrated in FIG. 4, the display unit 30 has plural pixels 32 arrayed therein in a matrix shape to form a predetermined pixel array pattern. Each pixel 32 has a configuration in which three sub-pixels (a red sub-pixel 32*r*, a green sub-pixel 32*g*, and a blue sub-pixel 32*b*) are arranged in a horizontal direction. Each sub-pixel has a rectangular shape which is long in a vertical direction. The array pitch in the horizontal direction (horizontal pixel pitch Ph) of the pixels 32 and the array pitch in the vertical direction (vertical pixel pitch Pv) of the pixels 32 are substantially equal to each other. That is, a shape formed by one pixel 32 and a black matrix (BM) 34 (pattern material) surrounding the one pixel 32 is square (see a hatched area 36). The aspect ratio of each pixel 32 is not equal to 1 but is so set as to satisfy the inequality: [the length in the horizontal direction (lateral length)]>[the length in the vertical direction (longitudinal length)].

Since a pixel array pattern formed by the sub-pixels 32*r*, 32*g*, and 32*b* of the plural pixels 32 is defined by a BM pattern 38 of the BM 34 surrounding the respective sub-pixels 32*r*, 32*g*, and 32*b* as can be apparently seen from FIG. 4, and the moire occurring when the display unit 30 and the conductive film 10 or 11 are superimposed on each other is generated by the interference between the BM pattern 38 of the BM 34 of the display unit 30 and the wiring pattern 24 of the conductive film 10 or 11, the BM pattern 38 is herein considered to be identical to the pixel array pattern, although it, strictly speaking, is identical to a reversed pixel array pattern.

When the conductive film 10 or 11, for example, is disposed on the display panel of the display unit 30 having the BM pattern 38 formed by the BM 34, the wiring pattern 24 of the conductive film 11 has been optimized in terms of visibility of moire with respect to the BM (pixel array) pattern 38 and then randomized, so that there is no interference in spatial frequency between the array period of the pixels 32 and the wiring arrangement of the thin metal wires 14 of the conductive film 10 or 11, occurrence of moire is suppressed, and thus the wiring pattern is proved excellent in visibility of moire.

The display unit 30 illustrated in FIG. 4 may be configured as a display panel such as a liquid crystal panel, a plasma panel, an organic EL panel, and an inorganic EL panel.

Figure 5:
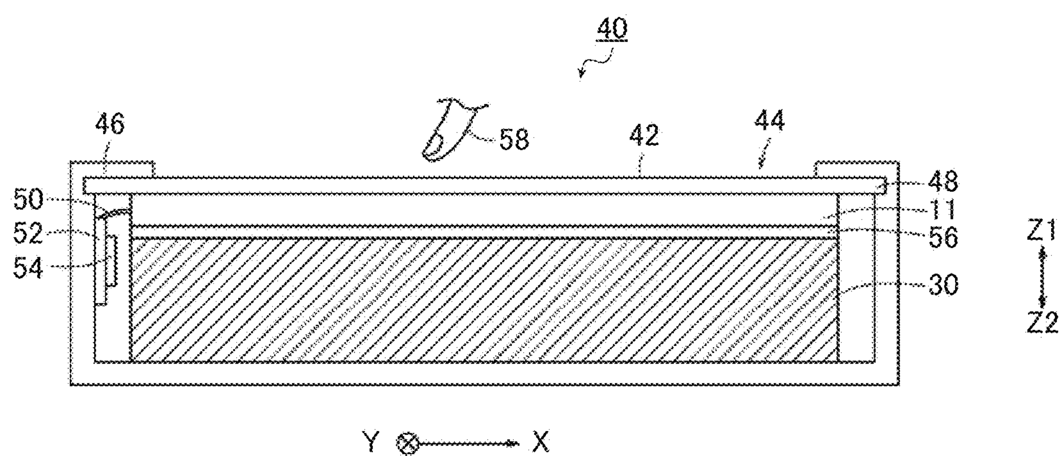
FIG. 5 is a cross-sectional view schematically illustrating an example of a display device in which the conductive film illustrated in FIG. 3 is incorporated.

Next, a display device in which the conductive film according to the present invention is incorporated will be described below with reference to FIG. 5. In FIG. 5, a projected capacitive type touch panel in which the conductive film 11 according to the second embodiment of the present invention is incorporated will be described as a representative example of a display device 40, but it is needless to say that the present invention is not limited to this example.

As shown in FIG. 5, the display device 40 includes the display unit 30 (refer to FIG. 4) that can display a color image and/or a monochrome image, a touch panel 44 that detects a contact position on an input surface 42 (located on the side as directed by arrow Z1), and a housing 46 in which the display unit 30 and the touch panel 44 are housed. The user can access the touch panel 44 through a large opening provided in one face (on the side as directed by arrow Z1) of the housing 46.

The touch panel 44 includes not only the conductive film 11 (refer to FIG. 3) described above but also a cover member 48 stacked on one face (on the side as directed by arrow Z1) of the conductive film 11, a flexible substrate 52 electrically connected to the conductive film 11 through a cable 50, and a detection control unit 54 disposed on the flexible substrate 52.

The conductive film 11 is bonded to one face (on the side directed by arrow Z1) of the display unit 30 through an adhesive layer 56. The conductive film 11 is disposed on the display screen such that the other, main face side (second conductive portion 16*b* side) is opposite to the display unit 30.

The cover member 48 functions as the input surface 42 by covering one face of the conductive film 11. In addition, by preventing direct contact with a contact body 58 (for example, a finger or a stylus pen), it suppresses the occurrence of a scratch, adhesion of dust, and the like, and thus stabilizes the conductivity of the conductive film 11.

The material of the cover member 48 may be glass or a resin film. One face (on the side as directed by arrow Z2) of the cover member 48 may be coated with silicon oxide or the like and adhered to one face (on the side as directed by arrow Z1) of the conductive film 11. In order to prevent damage due to rubbing or the like, the conductive film 11 and the cover member 48 may be formed into a laminate.

The flexible substrate 52 is an electronic substrate having flexibility. In the example shown in this diagram, the flexible substrate 52 is fixed to an inner wall of the housing 46, while the position of the substrate may be varied. The detection control unit 54 constitutes an electronic circuit that catches a change in the capacitance between the contact body 58 and the conductive film 11 and detects the contact position (or the approach position) when the contact body 58 that is a conductor is brought into contact with (or comes closer to) the input surface 42.

The display device to which the conductive film according to the present invention is applied basically has the above-mentioned configuration.

Next, processes of evaluating a wiring pattern of the conductive film on visibility of moire with respect to a predetermined BM pattern of the display device, performing optimization, and giving irregularity in the present invention will be described below. That is, the processes of determining, in the conductive film according to the present invention, a wiring pattern which is optimized so that moire with respect to a predetermined BM pattern of the display device is not perceived by human visual sensation, and then given irregularity will be described below.

Figure 6:
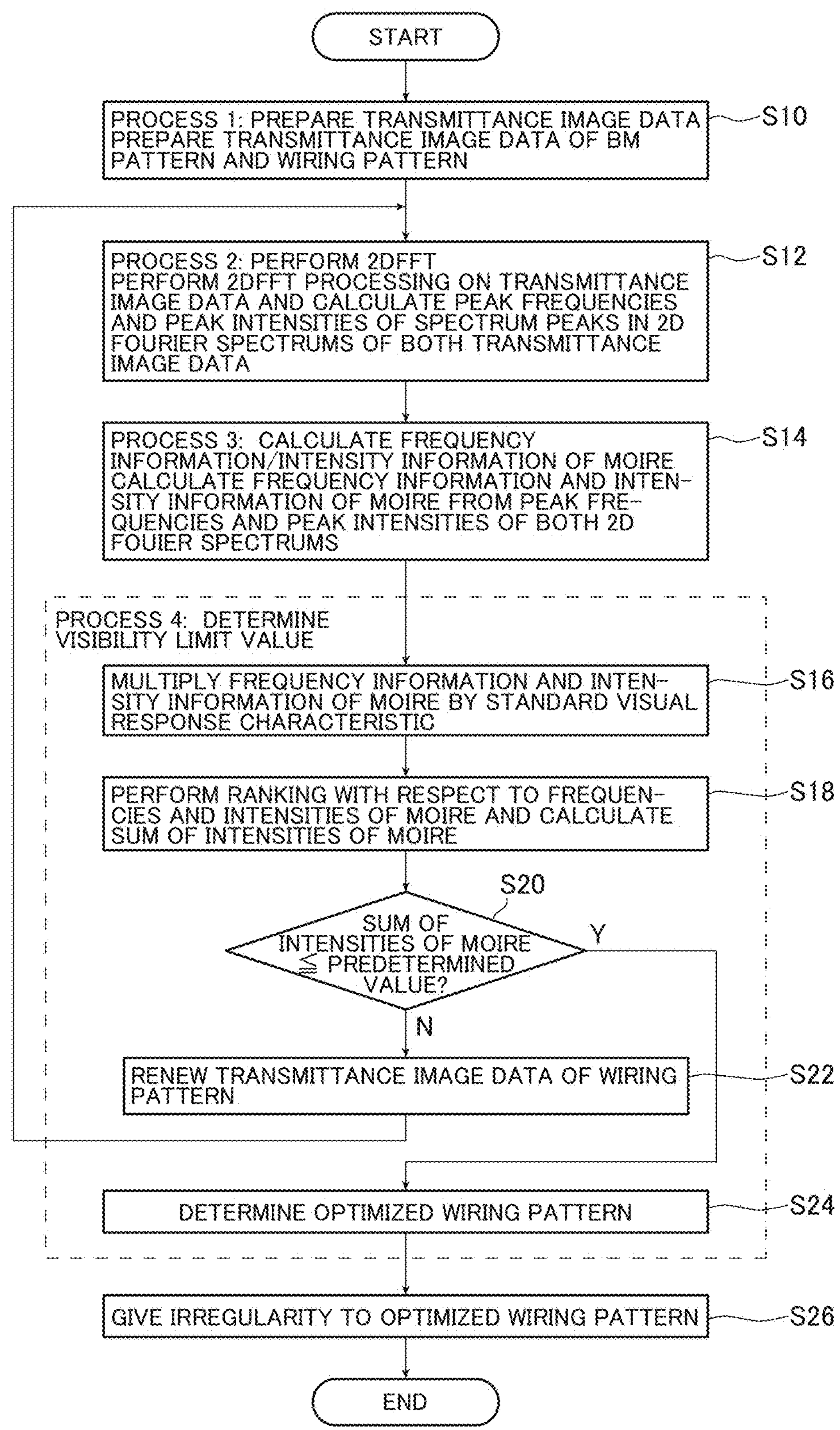
FIG. 6 is a flowchart illustrating a part of an example of a method for determining a wiring pattern of a conductive film according to the present invention.

FIG. 6 is a flowchart illustrating an example of a method of determining a wiring pattern of the conductive film according to the present invention.

In the method of determining a wiring pattern of the conductive film according to the present invention, frequencies and intensities of moire are calculated from the peak frequencies and intensities obtained by frequency analysis using fast Fourier transform (FFT) of the BM (pixel array) pattern of the display unit of the display device and the wiring pattern of the conductive film, frequencies and intensities of moire being not visible are empirically determined from the calculated frequencies and intensities of moire, and a wiring pattern satisfying these frequency and intensity conditions is determined as a wiring pattern optimized so that moire is not visually recognized. In the method according to the present invention that generally uses FFT for the frequencies and intensities of moire, the following processes are defined because the frequencies/intensities of a target may greatly vary depending on the way of usage.

In the method according to the present invention, first, as Process 1, transmittance image data of the BM pattern and the wiring pattern is prepared. That is, as illustrated in FIG. 6, in step S10, transmittance image data of the BM pattern 38 (BM 34) (see FIG. 4) of the display unit 30 of the display device 40 illustrated in FIG. 5 and transmittance image data of the wiring pattern 62 (of the thin metal wires 14) of the conductive film 60 (see FIG. 7B) are prepared and acquired. When the transmittance image data of the BM pattern 38 and the transmittance image data of the wiring pattern 62 are provided or stored in advance, the data may be acquired from among those provided or stored.

For example, as illustrated in FIG. 7A and FIG. 7C which is a partially-enlarged view of FIG. 7A, the BM pattern 38 of the display unit 30 can be set to a pattern which comprises the sub-pixels 32*r*, 32*g* and 32*b* for three colors R, G and B per pixel 32. When a single color is used and, for example, only the sub-pixels 32*g* of G channel are used, it is preferable that the transmittance image data of R channel and B channel be set to 0. In the present invention, image data of the BM 34, that is, the transmittance image data of the BM pattern 38 is not limited to the pattern having rectangular openings of the BM 34 (for the sub-pixels 32*r*, 32*g*, and 32*b*) as illustrated in FIG. 7C. A usable BM pattern may not have the rectangular openings of the BM 34 or a BM pattern having arbitrary BM openings may be designated and used. For example, the BM pattern is not limited to a pattern having simple rectangular openings, but the BM pattern may have notched rectangular openings, strip-like openings bent at a predetermined angle, curved strip-like openings, or hooked openings.

Meanwhile, the wiring pattern 62 of the conductive film 60 may be in a square lattice shape as illustrated in FIG. 7B, whereupon the thin metal wires 14 forming the wiring pattern are so arranged as to incline 45 degrees.

Here, the size of the transmittance image data of the BM pattern 38 and the wiring pattern 62 is defined to be, for example, 4096 (pixels)×4096 (pixels). In order to prevent or reduce artifacts of period during the FFT processing of Process 2 to be described later, it is preferable that the images of the BM pattern 38 and the wiring pattern 62 be each subjected to flipping processing in all directions (eight directions) as illustrated in FIG. 8. A new image size after the flipping processing is preferably the image size (8192 (pixels)=4096 (pixels)×2 for each side) of the area surrounded with a dotted line in FIG. 8 that corresponds to four images.

Next, as Process 2, the transmittance image data prepared in Process 1 is subjected to a two-dimensional fast Fourier transform (2DFFT (base 2)). That is, as illustrated in FIG. 6, in step S12, the transmittance image data of the BM pattern 38 and the transmittance image data of the wiring pattern 62 prepared in step S10 are each subjected to the 2DFFT (base 2) processing, and peak frequencies and peak intensities of plural spectrum peaks in each of the two-dimensional Fourier spectrums of the transmittance image data of the BM pattern 38 and the wiring pattern 62 are calculated. Here, the peak intensities are treated as their absolute values.

FIGS. 9A and 9B are diagrams illustrating intensity characteristics of the two-dimensional Fourier spectrums of the transmittance image data of the BM pattern 38 and the wiring pattern 62, respectively.

In FIGS. 9A and 9B, the intensity is high in white parts, that is to say, the white parts indicate spectrum peaks. Accordingly, the peak frequencies and the peak intensities of the spectrum peaks are calculated for each of the BM pattern 38 and the wiring pattern 62 from the results illustrated in FIGS. 9A and 9B. In other words, with respect to the spectrum peaks found in the intensity characteristics of the two-dimensional Fourier spectrums of the BM pattern 38 and the wiring pattern 62 as illustrated in FIGS. 9A and 9B, respectively, positions of the spectrum peaks, namely peak positions, on the frequency coordinates represent peak frequencies, and intensities of the two-dimensional Fourier spectrums at the peak positions are peak intensities.

Here, the peak frequencies and the peak intensities of the spectrum peaks of the BM pattern 38 and the wiring pattern 62 are calculated and acquired as follows.

First, in calculation of peaks for acquiring the peak frequencies, frequency peaks are calculated from the basic frequencies of the BM pattern 38 and the wiring pattern 62. This is because the transmittance image data to be subjected to the 2DFFT processing is acquired as discrete values and thus the peak frequency depends on the reciprocal of the image size. As illustrated in FIG. 10, frequency peak positions can be expressed by a combination of independent two-dimensional basic frequency vector components a(bar) and b(bar). Consequently, the acquired peak positions form a lattice shape. While FIG. 10 is a graph illustrating the frequency peak positions in the case of the BM pattern 38, the frequency peak positions for the wiring pattern 62 can be calculated in the same way.

Meanwhile, in acquiring of peak intensities, since the peak positions are calculated in the aforementioned acquisition of the peak frequencies, the intensities (absolute values thereof) of the two-dimensional Fourier spectrums at the peak positions are acquired. At this time, since digital data is subjected to the FFT processing, a peak position may be located on plural pixels at a time. For example, when the intensity (Sp) characteristics of a two-dimensional Fourier spectrum are expressed by the curve (analog values) illustrated in FIG. 11A, the digitized intensity characteristics of the same two-dimensional Fourier spectrum are expressed by the bar graph (digital values) illustrated in FIG. 11B, and the intensity peak P of the two-dimensional Fourier spectrum illustrated in FIG. 11A is on the boundary between two pixels in FIG. 11B corresponding to FIG. 11A. Accordingly, at the time of acquiring the intensity present at a peak position, the average of spectral intensities of some pixels selected in descending order of spectral intensity from an area including plural pixels around the peak position, for example, five pixels selected in descending order of spectral intensity from an area of 5×5 pixels, is preferably set as the peak intensity (absolute value).

Here, it is preferable that the acquired peak intensity be normalized with the image size. In the above-mentioned example, it is preferable that the peak intensity be normalized with an image size of 8192×8192 (Parseval's theorem).

Then, as Process 3, frequency information and intensity information of moire are calculated. That is, as illustrated in FIG. 6, in step S14, the frequency information and the intensity information of moire are respectively calculated from the peak frequencies and the peak intensities of the two-dimensional Fourier spectrums of the BM pattern 38 and the wiring pattern 62 calculated in step S12. Here, the peak intensities and the intensity information of moire are also treated as their absolute values.

Since moire is essentially caused by the multiplication of the transmittance image data of the wiring pattern 62 and the BM pattern 38 in the real space, a convolution of the two patterns is to be performed in the frequency space. However, since the peak frequencies and the peak intensities of the two-dimensional Fourier spectrums of the BM pattern 38 and the wiring pattern 62 are calculated in step S12, the difference (absolute value of the difference) between the frequency peaks of the two patterns may be calculated so as to determine the calculated difference to be the frequency information of moire, and the product of two combinations of vector intensities of the patterns may be calculated so as to determine the calculated product to be the intensity information (absolute value) of moire.

Here, the difference between the frequency peaks found in the intensity characteristics of the two-dimensional Fourier spectrums of the BM pattern 38 and the wiring pattern 62 respectively illustrated in FIGS. 9A and 9B corresponds to the relative distance between the peak positions on the frequency coordinates of the frequency peaks of the two patterns that are found in the intensity characteristics acquired by superimposing the intensity characteristics of the two-dimensional Fourier spectrums of the patterns on each other.

Since the number of spectrum peaks in the two-dimensional Fourier spectrums of the BM pattern 38 and the wiring pattern 62 is two or more for each spectrum, differences between the frequency peaks as values of the relative distance are also two or more in number, that is to say, the frequency information of moire is obtained as two or more pieces of information. Accordingly, when a large number of spectrum peaks are present in the two-dimensional Fourier spectrums, the number of pieces of frequency information of moire to be calculated also becomes large, and the time is required for the calculation thereof. In that case, only spectrum peaks with high peak intensities may be selected in advance from among the spectrum peaks in the respective two-dimensional Fourier spectrums. Since only the differences between the peaks respectively selected are calculated, the calculation time can be shortened.

Figure 12:
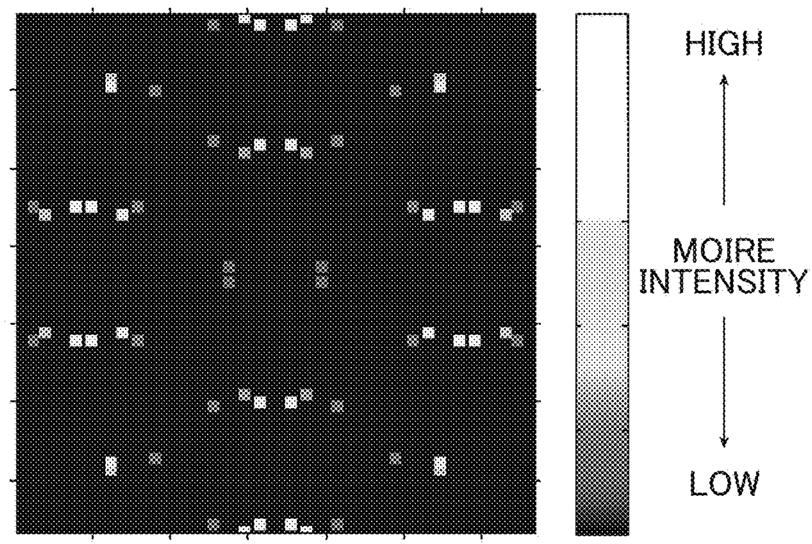
FIG. 12 is a diagram schematically illustrating frequency information and intensity information of moire generated by interference of the pixel array pattern illustrated in FIG. 7A and the wiring pattern illustrated in FIG. 7B.

The frequency information of moire and the intensity information of moire acquired in this way are illustrated in FIG. 12. FIG. 12 is a diagram schematically illustrating the frequency information and the intensity information of the moire generated by interference between the pixel array pattern illustrated in FIG. 7A and the wiring pattern illustrated in FIG. 7B, and it can be said that FIG. 12 illustrates the result of the convolution between the intensity characteristics of the two-dimensional Fourier spectrums illustrated in FIGS. 9A and 9B.

In FIG. 12, the frequency information of moire is expressed by positions on the vertical and horizontal axes and the intensity information of moire is expressed by a gray scale (achromatic colors), where a darker color indicates a lower intensity and a lighter color, namely, a color closer to white indicates a higher intensity.

Then, as Process 4, a visibility limit value of moire is determined.

Figure 13:
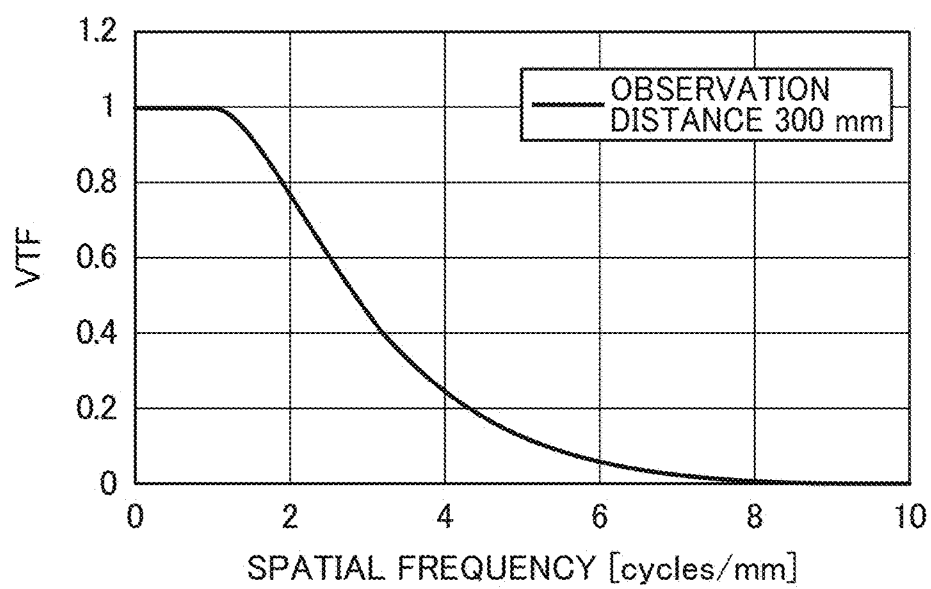
FIG. 13 is a graph illustrating an example of a standard visual response characteristic of human beings.

Specifically, first, as illustrated in FIG. 6, in step S16, a standard visual response characteristic of human beings illustrated in FIG. 13 is applied to the frequency information of moire and the intensity information (absolute value thereof) of moire acquired in step S14, that is to say, the acquired frequency information and intensity information of moire are multiplied by the standard visual response characteristic, and the frequency of moire and the intensity (absolute value) of moire are calculated. In other words, the acquired frequency information and intensity information of moire are convoluted with a visual transfer function (VTF)

illustrated in FIG. 13 as an exemplary standard visual response characteristic of human beings. The visual transfer function has a Dooley-Shaw function as a basis and removes attenuation of sensitivity to low-frequency components.

In this embodiment, the Dooley-Shaw function at an observation distance of 300 mm under conditions of distinct vision is used as a standard visual response characteristic of human beings. The Dooley-Shaw function is a kind of visual transfer function (VTF) and is a representative function simulating a standard visual response characteristic of human beings. Specifically, the Dooley-Shaw function corresponds to the square of the contrast ratio characteristic of luminance. The horizontal axis of the graph represents the spatial frequency (unit: cycles/mm) and the vertical axis represents the VTF value (unit: dimensionless).

When the observation distance is 300 mm, the VTF value is constant (equal to 1) in a range of 0 cycle/mm to 1.0 cycles/mm and the VTF value tends to decrease as the spatial frequency increases. That is, this function serves as a low-pass filter that cuts off mid-to-high spatial frequency bands.

The actual visual response characteristic of human beings has a value smaller than 1 in the vicinity of 0 cycle/mm and thus shows a so-called band-pass filter characteristic. However, in this embodiment, the attenuation of sensitivity to low-frequency components is removed by setting the VTF value to 1 even in a very low spatial frequency band, as illustrated in FIG. 13. Accordingly, it is possible to suppress periodicity due to the repeated arrangement of the wiring pattern 62.

Then, as illustrated in FIG. 6, in step S18, with respect to the frequencies of moire and the intensities (absolute values thereof) of moire acquired in step S16, the sum of the intensities (absolute values thereof) of moire which are each corresponding to a frequency of moire falling within a predetermined frequency range determined depending on the standard visual response characteristic is calculated. That is, the convolution with the VTF is performed and then, with respect to the frequencies and intensities of moire, ranking for optimization is performed. Here, for the matching with the visual sensitivity, after the convolution with the VTF (step S16), conversion to the density is performed and the common logarithm is applied to the intensities. Further, in order to efficiently perform ranking in visibility of moire, the following conditions are empirically set up. That is, in the conditions below, the intensity of moire refers to the density as converted therefrom.

The conditions for the above ranking of patterns are as follows.

1. The ranking should be performed using only data in which the spatial frequency of moire is up to 3 cycles/mm.

2. A pattern involving an intensity of moire greater than or equal to −5 at a spatial frequency of 1.8 cycles/mm or less should not undergo the ranking.

3. A pattern involving an intensity of moire greater than or equal to −3.7 at a spatial frequency greater than 1.8 cycles/mm but not greater than 3 cycles/mm should not undergo the ranking.

Under these conditions, a smaller sum of the intensities of moire is more preferable, and the wiring pattern 62 which causes the sum of the intensities of moire to be less than or equal to 0 in terms of common logarithm (less than or equal to 1 in terms of antilogarithm) is set as the optimized wiring pattern 24 of the present invention. When plural optimized wiring patterns 24 are acquired, needless to say, the wiring pattern causing the smallest sum of the intensities of moire is set as the best wiring pattern 24, and the plural optimized wiring patterns 24 are ranked.

With respect to a large number of wiring patterns 62, the sum of the intensities of moire was calculated using simulation samples and actual samples, and three researchers evaluated the wiring patterns 62 and the sums of the intensities of moire. When the sum of the intensities of moire was less than or equal to −4 in terms of common logarithm (less than or equal to $10^{-4}$ in terms of antilogarithm), moire was not visually recognized at all through sensory evaluation, which was evaluated to be excellent (++). When the sum of the intensities of moire was greater than −4 but not greater than −2.5 in terms of common logarithm (greater than $10^{-4}$ but not greater than $10^{-2.5}$ in terms of antilogarithm), moire was hard to visually recognize through sensory evaluation, which was evaluated to be good (+). When the sum of the intensities of moire was greater than −2.5 but not greater than 0 in terms of common logarithm (greater than $10^{-2.5}$ but not greater than 1 in terms of antilogarithm), moire was visually recognized through sensory evaluation but to a slight and negligible extent, which was evaluated to be fair (+−). When the sum of the intensities of moire was greater than 0 in terms of common logarithm (greater than 1 in terms of antilogarithm), moire was visually recognized through sensory evaluation, which was evaluated to be no good (unacceptable).

Therefore, in the present invention, the sum of the intensities of moire is limited to be less than or equal to 0 in terms of common logarithm (less than or equal to 1 in terms of antilogarithm).

Then, as illustrated in FIG. 6, in step S20, the sum of the intensities of moire calculated in step S18 is compared with a predetermined value so as to determine whether it is true or not that the sum of the intensities of moire is less than or equal to the predetermined value, for example, 0.

When it is determined as a result of comparison that the sum of the intensities of moire is greater than the predetermined value, the transmittance image data of the wiring pattern 62 is renewed to transmittance image data of another wiring pattern in step S22, and the routine is returned to step S12.

Here, the wiring pattern for data renewal may be provided in advance or may be prepared newly. When the wiring pattern is newly prepared, one or more of the rotation angle, the pitch and the pattern width in the transmittance image data of the wiring pattern may be changed, or the shape or the size of the openings of the wiring pattern may be changed. In addition, randomness may be given to such factors.

Thereafter, the calculation of the peak frequencies and the peak intensities in step S12, the calculation of the frequency information and intensity information of moire in step S14, the calculation of the frequency and intensity of moire in step S16, the calculation of the sum of the intensities of moire in step S18, the comparison of the sum of the intensities of moire with the predetermined value in step S20, and the renewal of the transmittance image data of the wiring pattern in step S22 are repeatedly performed until the sum of the intensities of moire is less than or equal to the predetermined value.

Figure 14:
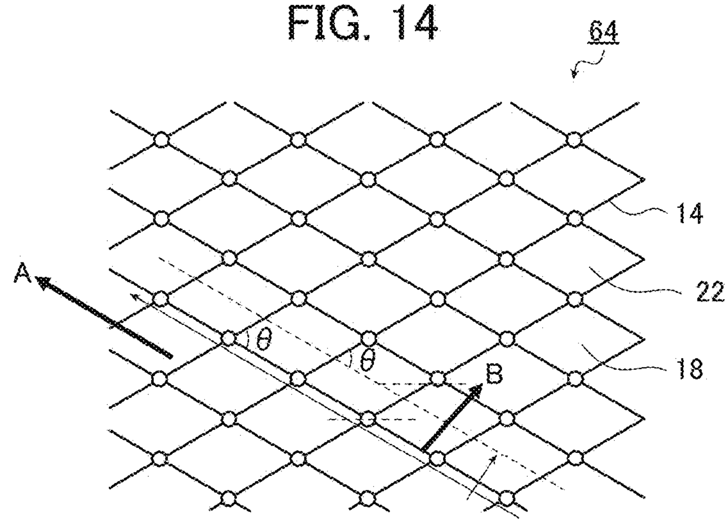
FIG. 14 is a diagram schematically illustrating an example of an optimized wiring pattern determined using the method for determining a wiring pattern illustrated in FIG. 6.

On the other hand, when it is determined that the sum of the intensities of moire is less than or equal to the predetermined value, the wiring pattern 62 is set in step S24 as an optimized rhomboidal wiring pattern 64 illustrated in FIG. 14.

Then, as illustrated in FIG. 6, in step S26, irregularity in a predetermined range determined depending on the width of the thin metal wires 14 is given to a rhomboid shape of the optimized rhomboidal wiring pattern 64 as specified in step S24, and the resultant wiring pattern is determined to be the wiring pattern 24 of the conductive film 10 or 11 according to the present invention.

Here, the giving of predetermined irregularity in step S26 can be performed as follows.

First, to the rhomboid shape of the optimized wiring pattern 64 illustrated in FIG. 14, predetermined irregularity is given by moving one line constituting rhomboid by a predetermined distance in parallel along a direction parallel to a side of rhomboid, that is, the direction of arrow A in the drawing, or a direction perpendicular to a side of rhomboid, that is, the direction of arrow B in the drawing.

In the present invention, when one line constituting rhomboid is moved in the direction A parallel to a side of rhomboid, the direction in which irregularity is given is referred to as the direction A parallel to a side of rhomboid, and in this case, the pitch of rhomboid is preserved before and after the irregularity is given. Accordingly, since the pitch of rhomboid is preserved and the angle is randomly changed, a pattern given irregularity as such can be considered as the pitch-preserved and angle-randomized pattern whose rhomboid shape is randomly changed while kept parallelogrammatic.

On the other hand, when one line constituting rhomboid is moved in the direction B perpendicular to a side of rhomboid, the direction in which irregularity is given is referred to as the direction B perpendicular to a side of rhomboid, and in this case, the angle θ of rhomboid is preserved before and after the irregularity is given. Accordingly, since the pitch of rhomboid is randomly changed and the angle is preserved, a pattern given irregularity as such can be considered as the pitch-randomized and angle-preserved pattern in which the pitch of rhomboid is randomly changed while the angle is kept constant.

In the present invention, when the direction in which the irregularity is given to the rhomboid shape of the optimized rhomboidal wiring pattern 64 is the direction A parallel to a side of rhomboid or the direction B perpendicular to a side of rhomboid, the irregularity is defined as a ratio of the average according to a normal distribution for the pitch of rhomboid after the irregularity is given with respect to the pitch of rhomboid before the irregularity is given.

In the present invention, it is preferable that the irregularity defined as above is limited to a predetermined range of 2% to 20% when the width of the thin metal wires is less than or equal to 3 μm, and to a range of 2% to 10% when the width of the thin metal wires is greater than 3 μm. In the case of the above-mentioned pitch-randomized pattern, it is more preferable that the irregularity is limited to a predetermined range of 2% to 10% when the width of the thin metal wires is less than or equal to 3 μm, and to a range of 2% to 8% when the width of the thin metal wires is greater than 3 μm.

The reason for limiting the irregularity to such a range is as follows: If the irregularity falls within the range, the occurrence of moire is further suppressed and the wiring pattern is made more excellent in visibility of moire, that is to say, the occurrence of moire is suppressed and the wiring pattern is kept excellent in visibility of moire even if the BM pattern on which the wiring pattern is superimposed is somewhat varied. In contrast, the above effects cannot be achieved by the giving of irregularity without the range.

The giving of predetermined irregularity in step S26 can be performed as described above.

In this way, the method for determining the wiring pattern of the conductive film according to the present invention is finished and the wiring pattern 24 of the conductive film 10 or 11 according to the present invention can be determined.

As a result, it is possible to manufacture the conductive film according to the present invention having the wiring pattern as optimized and then given irregularity that can be superimposed on a BM pattern of a display unit of a display device with no moire occurring and is thus excellent in visibility of moire.

In the present invention, since the irregularity within the predetermined range as above is further given to the wiring pattern which has been optimized with respect to a predetermined BM pattern, the occurrence of moire is further suppressed and the wiring pattern is made more excellent in visibility of moire, that is to say, the occurrence of moire is suppressed and the wiring pattern is kept excellent in visibility of moire even if the BM pattern on which the wiring pattern is superimposed is somewhat varied.

While the conductive film according to the present invention, the display device equipped with the conductive film, and the method for determining a pattern of the conductive film have been described above with reference to various embodiments and examples, the present invention is not limited to the embodiments and examples but, as a matter of course, may be improved or modified in various forms without departing from the gist of the present invention.

EXAMPLES

Hereinafter, the present invention will be described in more detail with reference to examples of the present invention.

A wiring pattern 24 was prepared by giving irregularity to the optimized rhomboidal wiring pattern 64 illustrated in FIG. 14, and the resultant wiring pattern was superimposed on the BM pattern 38 illustrated in FIG. 7A so as to conduct sensory evaluation about the visibility of moire.

In the optimized rhomboidal wiring patterns 64 illustrated in FIG. 14, the angle of rhomboid is 30° and the pitch of rhomboid is 200 μm. The thin metal wires 14 as used were two in type of line width, those with a line width of 2 μm and those with a line width of 4 μm.

A black matrix (168 v8 h32) having the BM pattern 38 illustrated in FIG. 7A was used as the BM 34.

Figure 15A:
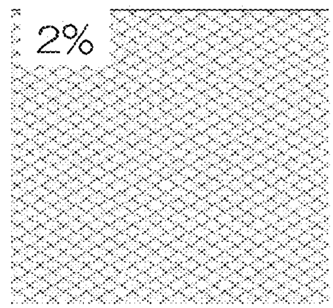
FIGS. 15A, 15B, and 15C are diagrams illustrating wiring patterns of examples and a comparative example, respectively.
Figure 16A:
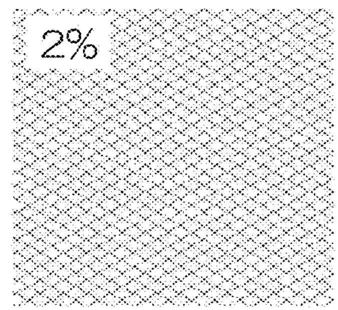
FIGS. 16A, 16B, and 16C are diagrams illustrating wiring patterns of the examples and the comparative example, respectively.

First, as Example 1, two types of wiring patterns, namely, a pitch-preserved wiring pattern (pitch preserved) in which the width of the thin metal wires 14 was 4 the angle of rhomboid was 30°, the pitch of rhomboid was 200 μm, the irregularity illustrated in FIG. 15A was 2%, and the irregularity direction was the direction A, and a pitch-randomized wiring pattern (angle preserved) in which the width of the thin metal wires 14, the angle of rhomboid and the pitch of rhomboid were the same as those in the aforementioned pitch-preserved wiring pattern, the irregularity illustrated in FIG. 16A was 2%, and the irregularity direction was the direction B were manufactured and were respectively bonded to the display screen of the display unit 30 having the BM 34. A commercially-available liquid crystal display (resolution: about 150 dpi, 10.1-inch, 1280×800) and four types of displays having identical specifications were used as the display unit 30 for confirmation. In a state where the display unit 30 was so controlled as to display in white (at the highest luminance), three researchers respectively performed sensory evaluation with regard to the visibility of moire. The observation distance from the display screen was set to 300 mm and the indoor illuminance was set to 300 lx.

Evaluation about Moire

The case where moire was not visualized was rated "A", the case where moire was visually recognized but at a level with no problem was rated "B", and the case where moire was visualized was rated "C". The average of the ratings by the researchers was regarded as a moire evaluation result.

The results are shown in Table 1.

Figure 15B:
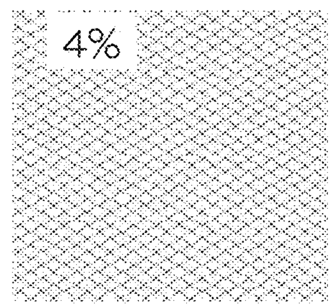
Figure 15C:
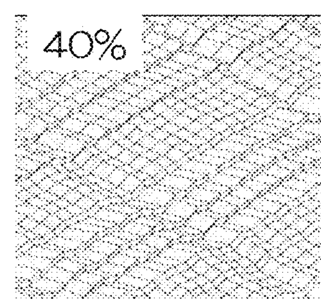
Figure 16B:
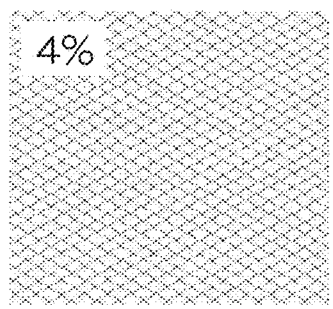
Figure 16C:
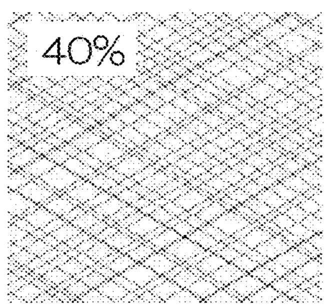

Subsequently, as Examples 2 to 5 and Comparative Examples 1 and 2, two types of wiring patterns were manufactured in the same way as in Example 1, except that the irregularity was replaced with 4%, 6%, 8%, 10%, 20% or 40%. The pitch-preserved wiring pattern of Example 2 in which the irregularity was 4% and the irregularity direction was the direction A and the pitch-randomized wiring pattern of Example 2 in which the irregularity was 4% and the irregularity direction was the direction B are illustrated in FIGS. 15B and 16B, respectively. In addition, the pitch-preserved wiring pattern of Comparative Example 2 in which the irregularity was 40% and the irregularity direction was the direction A and the pitch-randomized wiring pattern of Comparative Example 2 in which the irregularity was 40% and the irregularity direction was the direction B are illustrated in FIGS. 15C and 16C, respectively.

The two types of wiring patterns as manufactured in this way were respectively bonded to the display screen of the display unit 30 so as to conduct sensory evaluation about moire.

The results are shown in Table 1.

TABLE 1

| line width 4 [μm] angle 30 [deg] pitch 200 [μm] | | | | | | | |
|---|---|---|---|---|---|---|---|
| | Example 1 | Example 2 | Example 3 | Example 4 | Example 5 | Com. Ex. 1 | Com. Ex. 2 |
| Irregularity | 2% | 4% | 6% | 8% | 10% | 20% | 40% |
| Angle-preserved (direction B) | A | A | A | A | B | C | C |
| Pitch-preserved (direction A) | A | A | A | A | A | C | C |

Further, as Example 11, two types of wiring patterns were manufactured in the same way as in Example 1, except that the line width was changed to 2 μm. Moreover, as Examples 12 to 16 and Comparative Example 11, two types of wiring patterns were manufactured in the same way as in Example 1, except that the line width was changed to 2 μm and the irregularity was replaced with 4%, 6%, 8%, 10%, 20% or 40%. The manufactured wiring patterns were bonded to the display screen of the display unit 30 so as to conduct sensory evaluation about moire.

The results are shown in Table 2.

TABLE 2

| line width 2 [μm] angle 30[deg] pitch 200 [μm] | | | | | | | |
|---|---|---|---|---|---|---|---|
| | Example 11 | Example 12 | Example 13 | Example 14 | Example 15 | Example 16 | Com. Ex. 11 |
| Irregularity | 2% | 4% | 6% | 8% | 10% | 20% | 40% |
| Angle-preserved (direction B) | A | A | A | A | A | B | C |
| Pitch-preserved (direction A) | A | A | A | A | A | A | C |

As evidently seen from Table 1 and Table 2, in Examples 1 to 5 as given irregularity within its limitation range determined according to a line width of 4 μm and Examples 11 to 16 as given irregularity within its limitation range determined according to a line width of 2 μm, moire was not visualized or moire was visually recognized but at a level with no problem. In other words, the above Examples were proved excellent in visibility of moire as compared with Comparative Examples 1, 2 and 11 in which moire was visualized.

The advantageous effects of the present invention can be understood from the above description.

What is claimed is:

1. A conductive film adapted to be installed on a display unit of a display device, comprising:

a transparent substrate; and a conductive portion including a plurality of thin metal wires that is formed on at least one surface of the transparent substrate, wherein the conductive portion has a wiring pattern obtained by giving irregularity to a rhomboidal wiring pattern, said wiring pattern being formed by the plurality of thin metal wires in a meshed manner and arraying a plurality of openings, wherein the wiring pattern is superimposed on a pixel array pattern of the display unit, and wherein the wiring pattern is a randomized wiring pattern having randomized rhomboid shapes obtained by giving the irregularity in a predetermined range determined depending on a line width of the thin metal wires to rhomboid shapes of the rhomboidal wiring pattern which, with respect to frequencies of moire and intensities of moire obtained by applying a visual response characteristic of human beings to frequency information of moire and intensity information of moire calculated from peak frequencies and peak intensities of plural spectrum peaks in a two-dimensional Fourier spectrum of transmittance image data of the rhomboidal wiring pattern and peak frequencies and peak intensities of plural spectrum peaks in a two-dimensional Fourier spectrum of transmittance image data of the pixel array pattern, causes a sum of intensities of moire each corresponding to each of frequencies of moire falling within a predetermined frequency range determined depending on the visual response characteristic to be less than or equal to a predetermined value, wherein, when a direction in which the irregularity is given to the rhomboid shape is a direction parallel or perpendicular to a side of rhomboid, the irregularity is defined as a ratio of an average according to a normal distribution for a pitch of rhomboid after the irregularity is given with respect to the pitch of rhomboid before the irregularity is given, and wherein the predetermined range of the irregularity is from 2% to 20% when the line width of the thin metal wires is less than or equal to 3 μm and the predetermined range of the irregularity is from 2% to 10% when the line width of the thin metal wires is greater than 3 μm, wherein the frequency of moire and the intensity of moire are obtained by performing convolution with a visual transfer function as the visual response characteristic on the frequency information of moire and the intensity information of moire.

2. The conductive film according to claim 1, wherein the pitch of rhomboid is preserved before and after the irregularity is given when the direction in which the irregularity is given to the rhomboid shape is the direction parallel to a side of rhomboid, and wherein an angle of rhomboid is preserved before and after the irregularity is given when the direction in which the irregularity is given to the rhomboid shape is the direction perpendicular to a side of rhomboid.

3. The conductive film according to claim 1, wherein the predetermined frequency range of the frequency of moire is up to 3 cycles/mm, and wherein the wiring pattern undergoes ranking for optimization in a case in which it involves a frequency of moire less than or equal to 3 cycles/mm, and the wiring pattern undergoing the ranking for optimization causes the sum of intensities of moire to be less than or equal to 0 in terms of common logarithm on condition that the wiring pattern does not undergo the ranking for optimization in a case in which it involves an intensity of moire greater than or equal to −5 in terms of common logarithm at a frequency of moire less than or equal to 1.8 cycles/mm and in a case in which it involves an intensity of moire greater than or equal to −3.7 in terms of common logarithm at a frequency of moire greater than 1.8 cycles/mm but not greater than 3 cycles/mm.

4. The conductive film according to claim 1, wherein the frequency information of moire is given as differences between the peak frequencies of the wiring pattern and the peak frequencies of the pixel array pattern and the intensity information of moire is given as products of the peak intensities of the wiring pattern and the peak intensities of the pixel array pattern.

5. The conductive film according to claim 1, wherein the peak intensities are each an average of intensities in a plurality of pixels around a peak position.

6. The conductive film according to claim 1, wherein the peak intensities are normalized with the transmittance image data of the wiring pattern and the pixel array pattern.

7. The conductive film according to claim 1, wherein the pixel array pattern is a black matrix pattern.

8. A display device, comprising:

a display unit; and the conductive film according to claim 1 that is installed on the display unit.

9. The conductive film according to claim 1, wherein the visual transfer function has a Dooley-Shaw function as a basis and removes attenuation of sensitivity to low-frequency components.

10. A method for determining a wiring pattern of a conductive film, with the conductive film being adapted to be installed on a display unit of a display device and to have a wiring pattern obtained by giving irregularity to a rhomboidal wiring pattern, said wiring pattern being formed by the plurality of thin metal wires in a meshed manner and arraying a plurality of openings, comprising the steps of:

acquiring transmittance image data of a predetermined wiring pattern and transmittance image data of a pixel array pattern of the display unit, on which pattern the predetermined wiring pattern is superimposed;

calculating peak frequencies and peak intensities of plural spectrum peaks in a two-dimensional Fourier spectrum of the transmittance image data of the predetermined wiring pattern and peak frequencies and peak intensities of plural spectrum peaks in a two-dimensional Fourier spectrum of the transmittance image data of the pixel array pattern by performing a two-dimensional Fourier transform on the transmittance image data of the predetermined wiring pattern and the transmittance image data of the pixel array pattern;

calculating frequency information of moire and intensity information of moire from the peak frequencies and the peak intensities of the predetermined wiring pattern and the pixel array pattern thus calculated, respectively;

calculating frequencies of moire and intensities of moire by applying a visual response characteristic of human beings to the frequency information of moire and the intensity information of moire thus obtained;

making comparison with respect to the frequencies of moire and the intensities of moire thus obtained such that a sum of intensities of moire each corresponding to each of frequencies of moire falling within a predetermined frequency range determined depending on the visual response characteristic is compared with a predetermined value;

changing the transmittance image data of the predetermined wiring pattern to transmittance image data of a new wiring pattern in a case in which the sum of the intensities of moire is greater than the predetermined value, and repeating the steps of calculating the peak frequencies and the peak intensities, calculating the frequency information of moire and the intensity information of moire, calculating the frequencies of moire and the intensities of moire, and making comparison between the sum of the intensities of moire and the predetermined value until the sum of the intensities of moire is less than or equal to the predetermined value;

setting a rhomboidal wiring pattern which causes the sum of the intensities of moire to be less than or equal to the predetermined value as the wiring pattern of the conductive film; and giving the irregularity in a predetermined range determined depending on a width of the thin metal wires to rhomboid shapes of the set rhomboidal wiring pattern, and determining a randomized wiring pattern having randomized rhomboid shapes that the irregularity is given to be the wiring pattern of the conductive film, wherein the frequency of moire and the intensity of moire are obtained by performing convolution with a visual transfer function as the visual response characteristic on the frequency information of moire and the intensity information of moire, wherein the predetermined frequency range of the frequency of moire is up to 3 cycles/mm, and wherein the predetermined wiring pattern undergoes ranking for optimization in a case in which it involves a frequency of moire less than or equal to 3 cycles/mm, and the predetermined wiring pattern undergoing the ranking for optimization causes the sum of intensities of moire to be less than or equal to 0 in terms of common logarithm on condition that the predetermined wiring pattern does not undergo the ranking for optimization in a case in which it involves an intensity of moire greater than or equal to −5 in terms of common logarithm at a frequency of moire less than or equal to 1.8 cycles/mm and in a case in which it involves an intensity of moire greater than or equal to −3.7 in terms of common logarithm at a frequency of moire greater than 1.8 cycles/mm but not greater than 3 cycles/mm.

11. The method for determining a wiring pattern of a conductive film according to claim 10, wherein, when a direction in which the irregularity is given to the rhomboid shape is a direction parallel or perpendicular to a side of rhomboid, the irregularity is defined as a ratio of an average according to a normal distribution for a pitch of rhomboid after the irregularity is given with respect to the pitch of rhomboid before the irregularity is given, and wherein the predetermined range of the irregularity is from 2% to 20% when the width of the thin metal wires is less than or equal to 3 μm and the predetermined range of the irregularity is from 2% to 10% when the width of the thin metal wires is greater than 3 μm.

12. The method for determining a wiring pattern of a conductive film according to claim 10, wherein the pitch of rhomboid is preserved before and after the irregularity is given when the direction in which the irregularity is given to the rhomboid shape is the direction parallel to a side of rhomboid, and wherein an angle of rhomboid is preserved before and after the irregularity is given when the direction in which the irregularity is given to the rhomboid shape is the direction perpendicular to a side of rhomboid.

13. The method for determining a wiring pattern of a conductive film according to claim 10, wherein the frequency information of moire is obtained as differences between the peak frequencies of the predetermined wiring pattern and the peak frequencies of the pixel array pattern, and wherein the intensity information of moire is obtained as products of two sets of vector intensities, with one set comprising the peak intensities of the predetermined wiring pattern and the other comprising the peak intensities of the pixel array pattern.

14. The method for determining a wiring pattern of a conductive film according to claim 10, wherein the visual transfer function has a Dooley-Shaw function as a basis and removes attenuation of sensitivity to low-frequency components.

* * * * *